United States Patent [19]

Chang et al.

[11] Patent Number: 5,273,923
[45] Date of Patent: Dec. 28, 1993

[54] PROCESS FOR FABRICATING AN EEPROM CELL HAVING A TUNNEL OPENING WHICH OVERLAPS FIELD ISOLATION REGIONS

[75] Inventors: Ko-Min Chang; Clinton C. K. Kuo, both of Austin, Tex.; Ming-Bing Chang, Santa Clara, Calif.

[73] Assignee: Motorola, Inc., Schaumburg, Ill.

[21] Appl. No.: 773,791

[22] Filed: Oct. 9, 1991

[51] Int. Cl.$^5$ .................. H01L 21/302; H01L 21/38; H01L 27/115
[52] U.S. Cl. ........................... 437/43; 437/48; 437/52; 437/69; 437/70; 437/228; 257/315; 257/321; 257/314
[58] Field of Search ................ 437/43, 48, 69, 70, 437/228, 51, 52, 44; 365/185; 257/312, 315, 314, 321

[56] References Cited
U.S. PATENT DOCUMENTS

| | | | |
|---|---|---|---|
| 4,460,979 | 7/1984 | Brahmbhatt | 257/316 |
| 4,701,776 | 10/1987 | Perlegos et al. | 257/321 |
| 4,868,619 | 9/1989 | Mukherjee et al. | 252/316 |
| 5,077,230 | 12/1991 | Woo et al. | 437/69 |

FOREIGN PATENT DOCUMENTS

| | | | |
|---|---|---|---|
| 60-107864 | 6/1985 | Japan | 437/69 |
| 63-62382 | 3/1988 | Japan | 437/43 |

Primary Examiner—Olik Chaudhuri
Assistant Examiner—Richard A. Booth
Attorney, Agent, or Firm—Patricia S. Goddard

[57] ABSTRACT

An EEPROM cell (10) has a tunnel opening (28) which overlaps both an active region (12) and field isolation regions (14). A tunnel area (30), which is that portion of the cell in which electrons tunnel through a tunnel dielectric (32) to charge or discharge a floating gate (22) during device operation, is defined as the overlapped portion of the tunnel opening (28) and the active region (12). By having the tunnel opening (28) larger than the tunnel area (30), etch processes used to pattern the opening in a gate dielectric (26) are more easily controlled and the active region area beneath the floating gate is reduced. The EEPROM cell (10) has a tunnel area which is limited in size by lithographic resolution capabilities rather than by limitations in dielectric etch processes. The tunnel features increase a capacitance coupling ratio of the cell.

15 Claims, 2 Drawing Sheets

PROCESS FOR FABRICATING AN EEPROM CELL HAVING A TUNNEL OPENING WHICH OVERLAPS FIELD ISOLATION REGIONS

FIELD OF THE INVENTION

The present invention relates to EEPROMs (electrically erasable and programmable read-only memories) in general, and more specifically to EEPROMs having a tunnel opening, or tunnel window, which overlaps a field isolation region.

BACKGROUND OF THE INVENTION

EEPROMs are non-volatile memory devices which are erased and programmed using electrical signals. Within an EEPROM device are a plurality of memory cells, each of which may be individually programmed and erased. In general, each EEPROM cell has two transistors. As an example, a FLOTOX (floating gate-tunnel oxide) EEPROM cell includes a floating gate transistor and a select transistor. The select transistors in an EEPROM device are used to select individual EEPROM cells which are to be erased or programmed. The floating gate transistors in the device are those transistors which actually perform the erase and program operations in the individual cells. To program and erase a cell, a phenomenon known as electron tunneling is used to store either a positive or a negative charge, respectively, on a floating gate electrode of the floating gate transistor. Programming is accomplished by applying a positive voltage to a drain of the floating gate transistor while a control gate is held at ground. As a result, electrons tunnel from the floating gate of the transistor through a tunnel dielectric to the drain, leaving the floating gate positively charged. An EEPROM cell is erased by storing negative charge on the floating gate. Negative charge storage on the floating gate is generally achieved by applying a positive voltage to the control gate of the transistor while grounding the drain and source. Such a bias causes electrons to tunnel from the drain through the tunnel dielectric to the floating gate, creating a negative charge on the floating gate.

In order to maximize the performance of an EEPROM device, program and erase times must be kept to a minimum. To improve program and erase speeds, it is important to maximize a parameter known as the capacitance coupling ratio, or the coupling coefficient. The capacitance coupling ratio is defined as:

$$K_{cr} = \frac{C1}{C1 + C2}.$$

In the above equation, $K_{cr}$ is the coupling coefficient, C1 is the capacitance between the control gate and the floating gate of the floating gate transistor, and C2 is the capacitance between the floating gate and the substrate. Maximizing the capacitance coupling ratio implies maximizing the voltage which appears across the tunnel dielectric during programming and erasing operations, which in turn implies minimizing the time required to charge the floating gate. As an example of how the capacitance coupling ratio affects EEPROM cell operation, a capacitance coupling ratio in which $K_{cr}=0.70$ implies that during an erase operation in which 18 volts is applied to the drain, only 70% of the 18 volts (i.e. 12.6 volts) is transferred across the tunneling dielectric. As the coupling ratio increases, a higher voltage appears across the tunnel dielectric, resulting in shorter charge times. Therefore, erase and programming times can be reduced if $K_{cr}$ if maximized.

In order to maximize the capacitance coupling ratio, EEPROM manufacturers generally try to minimize the area of the tunnel dielectric through which electrons travel, hereinafter referred to as the tunnel area. By making the tunnel area smaller, the capacitance between the floating gate and the substrate, C2 in the above equation, is reduced, thereby increasing $K_{cr}$. One common approach to forming the smallest tunnel area possible is to lithographically define a portion of a dielectric layer through which electrons will travel. In many EEPROM devices, a gate dielectric layer on the order of 200–400 Å (20–40 nm) exists between a floating gate and an underlying channel region. Because such dielectric thicknesses generally prohibit electron tunneling at normal operation voltages, but are otherwise necessary for adequate electrical isolation, a portion of the gate dielectric layer must be made thinner. Thinning of the gate dielectric layer typically occurs by etching a portion of the gate dielectric which is defined by a tunnel opening, also known as a tunnel window, to expose a channel region. A very thin tunnel dielectric, on the order of 50–100 Å (5–10 nm), is then grown or deposited on the exposed portion of the channel, thereby establishing the tunnel area. Using this process, a tunnel area can theoretically be made as small as the resolution limit of lithographic equipment used to define the tunnel opening. For example, lithography equipment having a minimum resolution of 0.8 μm will, in best case, result in a minimum tunnel area of 0.8 μm×0.8 μm.

While an EEPROM manufacturer may be able to successfully pattern a tunnel opening having dimensions equal to the lowest lithographic resolution limit, transferring the tunnel opening pattern into an actual opening in the gate dielectric is a challenge. In particular, it is very difficult to control a dielectric etch process which etches an opening of such small area. Typically, dry etches are very controllable and would be suitable for use in defining a tunnel area in an EEPROM device, except that dry etches tend to damage the channel region within a substrate. For this reason, most manufacturers prefer to use a less controllable, but less damaging, wet etch. However, due to the inability to tightly control the wet etch process, a tunnel opening which is lithograpnically defined as 0.8 μm×0.8 μm may translate into a 0.9 μm×0.9 μm opening in the gate dielectric. Another manufacturing problem associated with known EEPROM devices is that of ensuring repeatability in tunnel opening size from cell to cell and from device to device. A consistent tunnel area is essential in establishing a uniform level of EEPROM device performance. Yet another problem is that alignment of the tunnel opening is very critical. Therefore, to reduce chances of misalignments, many manufacturers include misalignment tolerances in the device layout. Unfortunately, these built-in tolerances undesirably increase the overall device size and undesirably increase floating gate-to-substrate capacitance, C2, due to an increase in the size of the active area beneath the floating gate.

SUMMARY OF THE INVENTION

Many of the shortcomings of the prior art are overcome by the present invention. In one form of the invention, an EEPROM cell layout is comprised of an active region and a field isolation region which encompasses all regions that are not active regions. The layout is also comprised of a floating gate region which overlaps both the active region and the field isolation region. A tunnel opening also overlaps both the active region and the field region, and is contained within the floating gate region. A tunnel area of the cell layout is defined by the overlap of the tunnel opening and the active region. A process for forming an EEPROM cell is also provided.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

The present invention enables an EEPROM cell to have a minimal tunnel area for improved performance, without necessitating overly complex fabrication techniques. Many existing EEPROM devices form a tunnel area by patterning an opening in a gate dielectric. In order to minimize the tunnel area, minimum lithographic resolution limits are used to form the smallest opening possible. Once the opening is lithographically patterned, the opening must then be transferred into the gate dielectric by etching. Etch techniques used to transfer the opening are often uncontrollable, resulting in inconsistent and poor device performance and tunnel areas which are often larger than the initial tunnel opening patterned. The present invention achieves the same minimum tunnel area as that achieved in known EEPROM devices without having the entire tunnel area limited by the ability to etch the dielectric controllably. Rather than have the size of the tunnel area limited by dielectric etching techniques, as in existing processes, the present invention's lower limit on tunnel area is defined lithographically.

In addition to having reduced process complexity, the present invention also results in an increase in the capacitance coupling ratio, thereby improving performance over conventional EEPROM devices. The present invention permits the active region beneath the floating gate of the floating gate transistor to be made smaller than in conventional EEPROM devices. A smaller active region is an advantage because the smaller the active region area, the lower the capacitance between the floating gate and the substrate (C2 from the above equation). As described earlier, a reduction in C2 increases $K_{cr}$, the capacitance coupling ratio, which implies an improvement in device program and erase speeds. From another point of view, an increase in the capacitance coupling ratio allows an EEPROM device to operate at lower voltages.

In one embodiment of the invention, a tunnel opening overlaps both a gate dielectric overlying an active region of the EEPROM cell and a field isolation region. Since the tunnel opening is larger than the tunnel area to be defined, and since the tunnel opening partially overlies field isolation regions, patterning the tunnel opening into an underlying dielectric layer need not be well controlled in order to achieve a minimum tunnel area. The size relationship between the tunnel opening and the tunnel area also allows a smaller active area to be formed beneath the floating gate, resulting in a reduction in floating gate-to-substrate capacitance, C2. Thus, the present invention favorably increases the capacitance coupling ratio and consequently improves device performance. Each of the these advantages will become apparent throughout the following detailed description.

Figure 1:
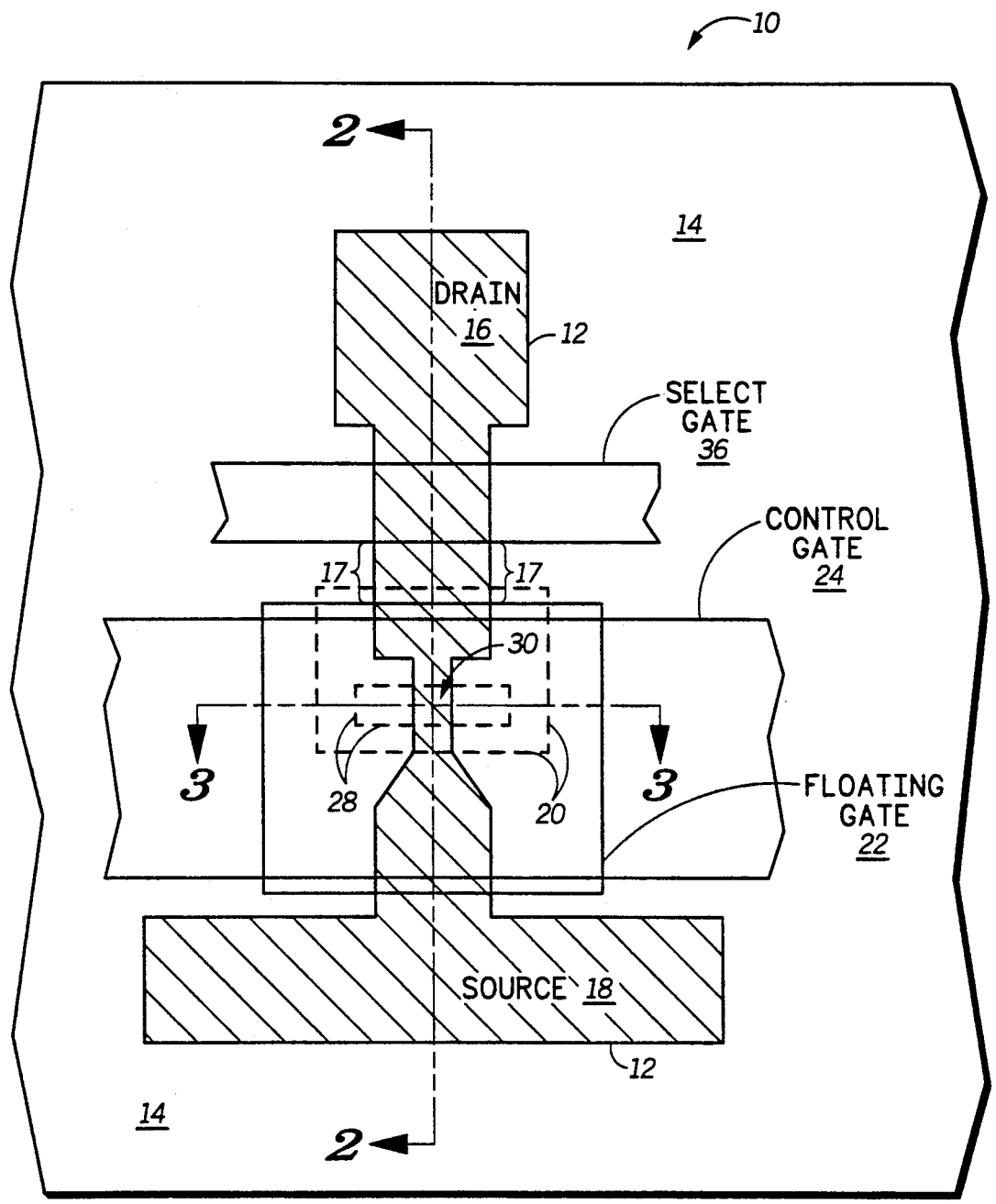
FIG. 1 is a layout of an EEPROM cell in accordance with the invention.

FIG. 1 illustrates a layout of an EEPROM cell 10 in accordance with the present invention. The layout is not illustrated completely in either a top-down or a bottom-up manner for purposes of pictorial clarity. The reader is directed to FIGS. 2 and 3, which are cross-sectional views of the EEPROM cell of FIG. 1 taken along the lines 2—2 and 3—3, respectively, for a better understanding of the sequence of layers in the cell.

Figure 2:
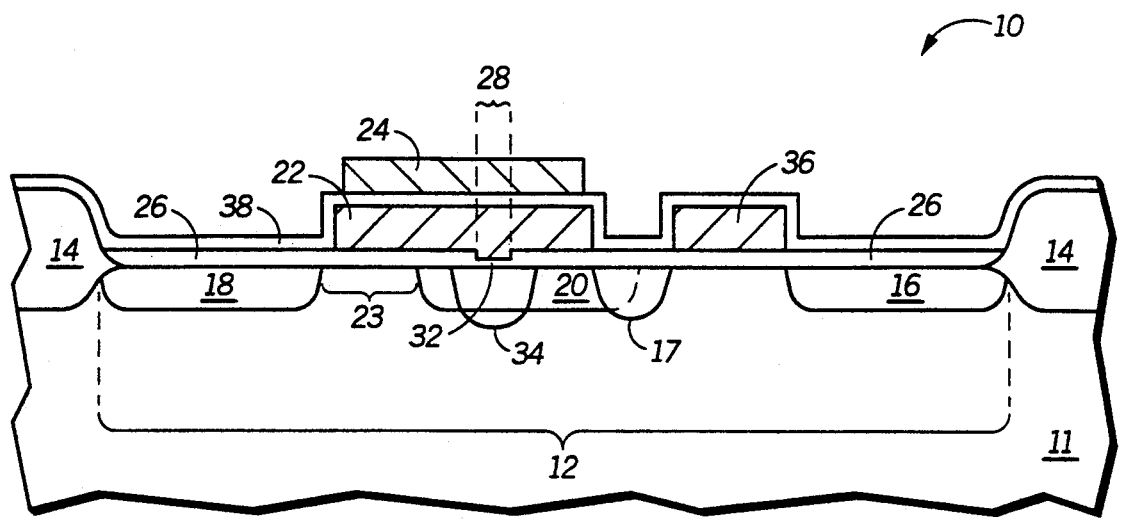
FIG. 2 is a cross-sectional view illustrating the EEPROM cell of FIG. 1 taken along the line 2—2, as the cell might be fabricated in an actual device.

As illustrated in FIG. 1, cell 10 includes an active region 12. Portions of the layout which are not contained within active region 12 are field isolation regions 14. Within active region 12, a drain region 16 and a source region 18 of the cell are formed, for example by ion implantation of a dopant. Similarly, a source/drain region 17 is formed within active region 12 between a select gate 36 of a select transistor and a floating gate 22 of a floating gate transistor. Source/drain region 17 serves as a source for the select transistor of the cell, and as a drain for the floating gate transistor of the cell. Active region 12, field isolation regions 14, drain region 16, and source region 18 of cell 10 are also illustrated in FIG. 2 which represents one implementation of the present invention. In FIG. 2, cell 10 is formed on a substrate material 11 which is typically silicon or another semiconductor material. Field isolation regions 14 are formed on the substrate in a conventional manner, for example by LOCOS (localize oxidation of silicon), thereby defining active region 12. Drain and source regions 16 and 18, respectively, and source/drain region 17 are formed by implanting impurity atoms, or dopants, into the substrate by known methods.

Referring again to FIG. 1, the layout of cell 10 also includes a tunnel implant region 20. While tunnel implant region 20 overlaps both active region 12 and field isolation regions 14, in a fabricated cell the implant regions will be contained within active region 12, as illustrated in FIG. 2. During implantation, impurity atoms cannot penetrate through thick dielectric layers, such as field isolation regions 14. Therefore, actual doping will be confined to the active regions of the substrate which are defined by tunnel implant region 20 of FIG. 1. Tunnel implant region 20 also partially overlaps source/drain region 17.

As in most conventional EEPROM devices, EEPROM cell 10 also has a select gate 36, a floating gate 22, and a control gate 24, as illustrated in FIG. 1. Select gate 36 is the control electrode for the select transistor of cell 10. The remaining elements of the select transistor are source/drain region 17, which functions as the source for the select transistor, and drain region 16. The select transistor is the transistor which determines whether or not an individual cell has been selected to be programmed or erased.

Floating gate 22 and control gate 24 are gates of the floating gate transistor of cell 10 which actually program or erase the cell. As described earlier, an EEPROM cell is programmed by tunneling electrons from the floating gate, through a gate dielectric, to the drain of the floating gate device, thereby accumulating a positive charge on the floating gate. In the cell illustrated in FIG. 2, electrons tunnel from floating gate 22 to source/drain region 17, which functions as the drain for the floating gate transistor, during a programming operation. Erasure of the cell is accomplished by tunneling electrons from the drain of the floating gate device, through the gate dielectric, and into the floating gate 22. In cell 10, erasure occurs by tunneling electrons from source/drain region 17 to floating gate 22. Also illustrated in FIG. 2 is a gate dielectric 26. Floating gate 22 is formed on gate dielectric 26, above a channel region 23 of the floating gate transistor and above tunnel implant region 20. In order to charge the floating gate, electrons must also tunnel through a portion of gate dielectric 26 which lies beneath the floating gate. Dielectric layers, such as gate dielectric 26, which are used to electrically isolate conducting or semiconducting layers typically are on the order of 150–300 Å (15–30 nm) thick. Electrons will not effectively tunnel through a dielectric layer of this thickness under normal operating voltages (e.g. 6–20 volts); therefore a thinner, tunnel dielectric, for example a tunnel dielectric 32, is necessary.

In conventional EEPROM devices, a tunnel dielectric is often achieved by patterning an opening in the gate dielectric layer to expose a portion of the active region of the substrate and subsequently growing or depositing a tunnel dielectric on the exposed substrate to a thickness of about 50–100 Å (5–10 nm). As discussed previously, there is a significant disadvantage with many of these existing patterning approaches which relate to manufacturing. Because it is desirable to have the tunnel area as small as possible, many manufacturers form the tunnel window by patterning the smallest possible opening. Transferring a patterned opening of such dimensions into a dielectric is difficult to control, and generally results in a tunnel area which is quite a bit larger than the original opening.

With the present invention, the minimum tunnel area is still determined by lithographic resolution limits; however, fabrication tolerances of an EEPROM cell formed in accordance with the invention are much more relaxed in comparison to conventional EEPROM cell processing. As illustrated in the layout of FIG. 1, a tunnel opening 28 is formed within tunnel implant region 20 and overlaps both active region 12 and field isolation regions 14 to define a tunnel area 30. Tunnel area 30 is that portion of the cell through which electrons will travel to and from floating gate 22. By contrast, conventional EEPROM cells have a tunnel opening completely contained within the active region. A disadvantage in forming the tunnel opening completely within the active region is that the active region must be made large enough to offset any misalignment of the tunnel opening. The "extra" active region required to safeguard against misalignment, however, undesirably increases the overall size of the cell and undesirably increases the floating gate-to-substrate capacitance. In practicing the present invention, generous misalignment tolerances are established such that a misalignment of tunnel opening 28 in any direction with respect to active region 12 is unlikely to affect the characteristics of tunnel area 30. In addition, because the present invention does not require an "extra" active region, floating gate-to-substrate capacitance is reduced, resulting in a higher capacitance coupling ratio and thus improved device performance.

Another advantage of the present invention with respect to fabrication is the fact that a tunnel area of minimum size is achievable by using a tunnel opening having dimensions larger than that of the resulting tunnel area and larger than that of the lowest lithographic resolution limit. For example, forming a 0.5 μm by 0.5 μm tunnel area can be achieved by patterning a device with a tunnel opening which is larger in area than 0.5 μm by 0.5 μm. Because the tunnel area of the present invention is defined by the overlap of tunnel opening 28 and active region 12, the minimum tunnel area will be determined by the smallest dimension of the tunnel opening and the smallest dimension of the active region. Referring to FIG. 1, tunnel area 30 is defined by the length of tunnel opening 28 and the width of active region 12 which overlaps the tunnel opening. Accordingly, tunnel area adjustments are made by modifying the dimensions of either the tunnel opening, the active region, or both.

An EEPROM cell having a tunnel opening which overlaps both the active region and the field isolation regions, in accordance with the invention, may require processing techniques which are not traditionally performed in the fabrication of other EEPROM devices. As in other processes, tunnel opening 28 is used to pattern a gate dielectric, such as gate dielectric 26 of FIG. 2. But because the tunnel opening overlaps portions of field isolation regions 14, the isolation regions will also be subjected to any etch which is used to remove portions of the gate dielectric. Etching of the field isolation regions is not necessarily harmful unless the extent of etching leaves tunnel implant region 20 no longer beneath field isolation regions 14, in which case current leakage may occur during device operation. According to the layout of FIG. 1, tunnel implant region 20 overlaps both active region 12 and field isolation regions 14. As stated earlier, implanted impurity atoms which actually form the tunnel implant region in the device are blocked by field isolation regions 14 such that a doped region exists only in active region 12. In other words, the tunnel implant region in the device is self-aligned to the field isolation regions. Out-diffusion of impurity atoms in the implant regions results in portions of the tunnel implant region being beneath the field isolation regions. By etching the field isolation regions, the tunnel implant may no longer be beneath the field isolation regions, depending upon the extent of etching. If the field isolation regions no longer overlie edges of the tunnel implant region, current leakage during cell programming may occur as a result of the junction now being under a thin dielectric rather than under the field isolation regions.

Figure 3:
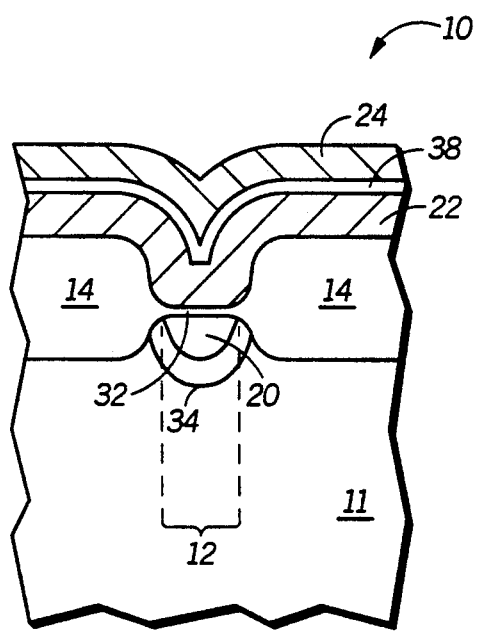
FIG. 3 is a cross-sectional view illustrating the EEPROM cell of FIG. 1 taken along the line 3—3, as the cell might be fabricated in an actual device.

To overcome the potential problem of current leakage, an additional implant step is performed to ensure that the junction is kept beneath field isolation regions 14. As illustrated in FIG. 3, tunnel implant region 20 is self-aligned to field isolation regions 14. Overlying tunnel implant region 20 is tunnel dielectric 32, which is formed in a conventional manner, for example by patterning gate dielectric 26 (see FIG. 2) with tunnel opening 28 and subsequently growing a thin tunnel dielectric 32 in the patterned region. As an example, tunnel dielectric 32 may be silicon dioxide ($SiO_2$) thermally grown on a silicon substrate. As mentioned above, patterning gate dielectric 26 using tunnel opening 28 will cause field isolation regions 14 to become subjected to an etch used to remove the gate dielectric, in which case the edges of field isolation regions 14 may pull away from tunnel implant region 20. To compensate for the junction being effectively moved from beneath the field isolation region as a result of the etch, an additional implant, suitably called a patch implant, is performed. The patch implant will form a diffused region 34, as illustrated in FIG. 3, which pushes the junction back under field isolation regions 14. A suitable point for performing the patch implant is after patterning tunnel opening 28, and prior to actually transferring the pattern into gate dielectric 26, both of which occur prior to forming floating gate 22 and control gate 24. Thus, doping of the substrate only occurs in the overlapping portion of the tunnel opening and the active region, or in other words in and around the tunnel area. Doping concentration of the patch implant need not be the same as that of the tunnel implant, and in fact is preferably lower. As an example, tunnel implant region 20 may have a doping concentration on the order of $3 \times 10^{14}$ ions/cm$^2$ while that of the patch implant may be around $1 \times 10^{14}$ ions/cm$^2$. Furthermore, the tunnel and patch implants need not use the same doping species, but of course species of the same conductivity type are required.

An alternative approach to avoiding current leakage is also available. Rather than performing a patch implant, the implant step used to form tunnel implant region 20 could be adjusted, and other conventional processing steps varied, to provide sufficient out-diffusion of tunnel implant region 20. With the appropriate out-diffusion of tunnel implant region 20, keeping the junction beneath field isolation regions 14 is possible, even if the isolation regions are etched back. One method of sufficiently out-diffusing the tunnel implant region is to make the implant heavier than normal. For example, rather than a dosage of $3 \times 10^{14}$ ions/cm$^2$, a heavier implant on the order of $1 \times 10^{15}$ ions/cm$^2$ would help to reduce the amount of current leakage. Apart from using a heavier tunnel implant, other processing parameters can be changed to affect the out-diffusion of the tunnel implant region, such as adjusting the length and/or temperature of various thermal cycles.

A possible fabrication sequence for fabricating an EEPROM cell in accordance with the present invention, such as cell 10, is provided below. Field isolation regions 14 are formed on substrate 11, for instance using a LOCOS process. Next a sacrificial dielectric (not illustrated) is formed on active region 12 to protect the substrate from damage during a subsequent tunnel implant step. After forming tunnel implant region 20, the sacrificial dielectric is removed and gate dielectric 26 is formed on active region 12. Tunnel opening 28 is then patterned, for example in a photoresist material. At this stage, if desired to control current leakage of the device during programming, a patch implant is performed. The patch implant forms diffused region 34 in and around tunnel area 30. Following any patch implant, the tunnel opening is transferred into gate dielectric 26 by a wet chemical etch which removes portions of the dielectric within the window, thereby exposing a portion of active region 12. Next, a tunnel dielectric 32 is grown or deposited on the exposed portion of active region 12. A conducting layer, such as polysilicon is deposited on the device and patterned to form floating gate 22 and a select gate 36. As discussed earlier, a select transistor in an EEPROM device is often used to select those individual cells which are to be either programmed or erased. Upon forming the floating gate and the select gate, the cell is subjected to self-aligned ion implantation to form drain region 16, source/drain region 17, and source region 18. After adequately insulating floating gate and select gate electrodes with a dielectric layer 38, subsequent conducting layers, such as that used to form control gate 24, may then be deposited. Upon forming EEPROM cell 10 as representatively illustrated in FIG. 2, fabrication of the device is essentially complete, with the exception of the deposition and etching of commonly used interlevel dielectric, contact metallization, and passivation layers. Any additional steps required to fully complete cell 10 are well known in the art and will not be herein described.

The foregoing description and illustrations contained herein demonstrate many of the advantages associated with the present invention. In particular, it has been revealed that employing a tunnel opening which overlaps both the active region and the field isolation regions of an EEPROM device establishes a minimum tunnel area and a minimum active area beneath a floating gate. In the present invention, the tunnel area is actually smaller than the tunnel opening used to define the tunnel area, allowing cell fabrication to be limited by lithographic capabilities, rather than by hard-to-control dielectric etch processes. This results in more uniformly defined tunnel areas, and therefore more consistent device performance and reliability, in comparison to existing EEPROM devices. Another advantage of the present invention is that there is no need to form an active region larger than is required to define the tunnel area, thereby promoting a smaller overall cell size and a reduced floating gate-to-substrate capacitance. Most existing EEPROM devices must provide an "extra" active region to account for possible misalignments of a tunnel opening which defines the tunnel area, and thus require more layout area. Because the present invention has a tunnel area which is defined as the overlap between the tunnel opening and the active region, an "extra" active region is not necessary to ensure that the tunnel area is formed in the active region. By eliminating the "extra" active region, or in other words by reducing the total active area beneath the floating gate electrode, the capacitance coupling ratio ($K_{cr}$) is increased due to a reduction in floating gate-to-substrate capacitance (C2).

Thus is is apparent that there has been provided, in accordance with the invention, an EEPROM cell having a tunnel opening which overlaps field isolation regions and that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to the specific EEPROM cell layout described and illustrated, but instead can be implemented in any EEPROM cell. In addition, the invention is not limited to any of the specific processing techniques described. As one skilled in the art would recognize, numerous fabrication alternative exists. Therefore, it is intended that this invention encompass all such variations and modifications as fall within the scope of the appended claims.

We claim:

1. A process for fabricating an EEPROM cell comprising the steps of:
   providing a substrate material;
   defining an active region and a field isolation region of the substrate material;
   forming a tunnel implant region within the active region of the substrate material;
   forming a gate dielectric layer on the active region of the substrate material and overlying the tunnel implant region;
   defining a tunnel opening which overlaps both the tunnel implant region and the field isolation region;
   forming a patch implant region in the active region within the tunnel opening;
   removing a portion of the gate dielectric layer within the tunnel opening to expose a portion of the active region;
   forming a tunnel dielectric on the exposed portion of the active region, the tunnel dielectric defining a tunnel area; and
   forming a floating gate electrode overlying the tunnel dielectric.

2. The process of claim 1 wherein the step of removing a portion of the gate dielectric layer further comprises removing portions of the field isolation region within the tunnel opening.

3. The process of claim 2 wherein the step of removing a portion of the gate dielectric layer comprises removing a portion of the gate dielectric layer using a wet etch process.

4. The process of claim 1 wherein the step of providing a substrate material comprises providing a silicon substrate.

5. The process of claim 4 wherein the step of forming a tunnel dielectric comprises thermally growing silicon dioxide ($SiO_2$) on the exposed portion of the active region.

6. The process of claim 1 wherein the steps of forming a tunnel implant region and forming a patch implant region are both accomplished by ion implantation, and wherein the tunnel implant region is formed of a higher implant dosage than that of the patch implant region.

7. A process for fabricating an EEPROM cell comprising the steps of:
   providing a semiconductor substrate;
   defining an active region in the semiconductor substrate, the active region being bound by a field isolation region;
   forming a gate dielectric on the active region;
   patterning a tunnel opening on the semiconductor substrate, the tunnel opening overlapping a portion of both the active region and the field isolation region;
   introducing dopants through the tunnel opening to form a patch region in the portion of the active region within the tunnel opening;
   transferring the tunnel opening pattern into underlying portions of the gate dielectric and field isolation region such that the portion of the active region within the tunnel opening becomes exposed;
   forming a tunnel dielectric on the exposed portion of the active region; and
   forming a floating gate electrode overlying the tunnel dielectric.

8. The process of claim 7 further comprising the step of introducing dopants into the active region of the semiconductor substrate to form a tunnel implant region, and wherein the step of patterning a tunnel opening comprises patterning a tunnel opening which overlaps the tunnel implant region in the semiconductor substrate.

9. The process of claim 8 wherein introducing dopants is performed after patterning the tunnel opening and before transferring the tunnel opening into underlying portions of the gate dielectric and field isolation region.

10. The process of claim 8 wherein the step of forming a tunnel dielectric comprises growing $SiO_2$ on the exposed portion of the active region, and wherein the patch region is formed prior to growing $SiO_2$.

11. The process of claim 8 wherein the step of introducing dopants comprises introducing dopants to form a patch region having a lower concentration of dopants than the tunnel implant region.

12. The process of claim 7 wherein the step of patterning a tunnel opening comprises defining a tunnel opening in a resist material by lithographic methods.

13. The process of claim 7 wherein the step of transferring comprises a wet chemical etch which partially etches portions of the field isolation region within the tunnel opening.

14. A process for fabrication of an EEPROM cell comprising the steps of:
   providing a semiconductor substrate having an active region bounded by a field isolation region, the active region having a tunnel implant region formed therein and having an overlying gate dielectric layer;
   depositing a resist material on the substrate;
   patterning the resist material to form a tunnel opening which exposes a portion of the field isolation region and the gate dielectric overlying a portion of the active region;
   doping the active region within the tunnel opening to form a patch region;
   etching portions of the field isolation region and gate dielectric exposed by the tunnel opening such that the active region of the semiconductor substrate within the tunnel opening is exposed;
   forming a tunnel dielectric on the exposed portion of the active region; and
   forming an electrode overlying the tunnel dielectric.

15. The process of claim 14 wherein the step of doping is performed prior to the step of etching.

* * * * *